United States Patent
Ng et al.

(10) Patent No.: US 9,287,057 B2
(45) Date of Patent: Mar. 15, 2016

(54) PLASMONIC ENHANCED TANDEM DYE-SENSITIZED SOLAR CELL WITH METALLIC NANOSTRUCTURES

(71) Applicants: Siu-pang Ng, Hong Kong (HK); Chi-man Lawrence Wu, Hong Kong (HK); Chun-sing Lee, Hong Kong (HK)

(72) Inventors: Siu-pang Ng, Hong Kong (HK); Chi-man Lawrence Wu, Hong Kong (HK); Chun-sing Lee, Hong Kong (HK)

(73) Assignee: CITY UNIVERSITY OF HONG KONG, Hong Kong (HK)

( * ) Notice: Subject to any disclaimer, the term of this patent is extended or adjusted under 35 U.S.C. 154(b) by 216 days.

(21) Appl. No.: 13/910,426

(22) Filed: Jun. 5, 2013

(65) Prior Publication Data
US 2014/0360564 A1    Dec. 11, 2014

(51) Int. Cl.
*H01L 31/044* (2014.01)
*H01G 9/20* (2006.01)
*H01L 31/0224* (2006.01)
*H01L 31/0232* (2014.01)

(52) U.S. Cl.
CPC ............ *H01G 9/2072* (2013.01); *H01G 9/209* (2013.01); *H01G 9/2031* (2013.01); *H01G 9/2059* (2013.01); *H01L 31/02327* (2013.01); *H01L 31/022466* (2013.01); *Y02E 10/542* (2013.01); *Y02E 10/549* (2013.01)

(58) Field of Classification Search
CPC ........ H01L 31/00–31/078; Y02E 10/50–10/60
USPC ................................................. 136/243–265
See application file for complete search history.

(56) References Cited

U.S. PATENT DOCUMENTS

| | | | |
|---|---|---|---|
| 7,417,219 B2 | 8/2008 | Catrysse et al. | |
| 7,943,847 B2 | 5/2011 | Kempa et al. | |
| 7,949,210 B2 | 5/2011 | Durfee et al. | |
| 8,158,881 B2 | 4/2012 | Brabec et al. | |
| 2007/0289623 A1 | 12/2007 | Atwater et al. | |
| 2009/0032097 A1 | 2/2009 | Bigioni et al. | |
| 2010/0006144 A1 | 1/2010 | Baumberg et al. | |
| 2010/0126566 A1* | 5/2010 | Ji | 136/252 |
| 2010/0126567 A1 | 5/2010 | Kaufman | |
| 2010/0175745 A1 | 7/2010 | Kostecki et al. | |
| 2010/0206380 A1 | 8/2010 | Lindquist et al. | |
| 2010/0288356 A1 | 11/2010 | Linic et al. | |
| 2011/0126889 A1 | 6/2011 | Bourke, Jr. et al. | |
| 2011/0146771 A1 | 6/2011 | Chuang et al. | |
| 2011/0186119 A1 | 8/2011 | Atwater et al. | |
| 2011/0197959 A1 | 8/2011 | Catchpole et al. | |
| 2012/0073635 A1* | 3/2012 | Lee et al. | 136/255 |

OTHER PUBLICATIONS

Hagfeldt et al. "Dye-Sensitized Solar Cells." Chem. Rev., 110, pp. 6595-6663 (2010).
Oldenburg et al. "Nanoengineering of optical resonances." Chemical Physics Letters, 288, pp. 243-247 (1998).
Barcelo et al. "Nanosphere lithography based technique for fabrication of large area, well ordered metal particle arrays." HP Laboratories (2012).
Brown et al. "Plasmonic Dye-sensitized solar cells using core-shell metal-insulator nanoparticles." Nano. Lett, 11, pp. 438-445 (2011).
Yella et al. "Porphyrin-sensitized solar cells with cobalt (II/III)-based redox electrolyte exceed 12 percent efficiency." Science, 334, 629 (2011).
Odobel et al. "Recent advances and future directions to optimize the performances of p-type dye-sensitized solar cells." Coord. Chem. Rev. (2012).

* cited by examiner

*Primary Examiner* — Bach Dinh
(74) *Attorney, Agent, or Firm* — Heslin Rothenberg Farley & Mesiti P.C.; Melvin S. Li, Esq.

(57) ABSTRACT

The present invention is concerned with a plasmonic enhanced tandem dye sensitized solar cell system. The system has plasmonic nanostructures integrated to both a photoanode and a photocathode for enhancing respective electron and hole carrier transfer.

14 Claims, 15 Drawing Sheets

(i) to (iv) represents the reference without gold, 3 nm, 7 nm, 9 nm, and 11 nm nominal gold deposition thickness (i) to (iv) represents the reference without gold, 3 nm, 7 nm, 9 nm, and 11 nm nominal gold deposition thickness (i) to (iv) represents the reference without gold, 3 nm, 7 nm, 9 nm, and 11 nm nominal gold deposition thickness (i) to (iv) represents the reference without gold, 3 nm, 7 nm, 9 nm, and 11 nm nominal gold deposition thickness

PLASMONIC ENHANCED TANDEM DYE-SENSITIZED SOLAR CELL WITH METALLIC NANOSTRUCTURES

FIELD OF THE INVENTION

The present invention is concerned with a solar cell system, and in particular plasmonic enhanced tandem dye-sensitized solar cell with metallic nanostructures and method of manufacture thereof.

BACKGROUND OF THE INVENTION

Conventional dye-sensitized solar cells (DSSC) utilize dye molecules as the only active light harvesting components to capture the incoming solar radiation. Since there are two orders of magnitude difference between the sizes of the dye molecules which are approximately 2 nm for typical N719 Ruthenium dye whereas the AM1.5 solar spectrum spans from 400 nm to 2000 nm, the incident light collection efficiency of the dye molecules alone is generally low. While the mismatch can be compensated by increasing the thickness of the photoanode layer, the increase in the thickness deters the overall transparency thus degrades the photocathode performance.

The present invention seeks to provide a system which addresses these issues or to increase the efficiency of a solar cell system, or at least to provide an alternative to the public.

SUMMARY OF THE INVENTION

According to a first aspect of the present invention, there is provided a plasmonic enhanced tandem dye sensitized solar cell system comprising plasmonic nanostructures integrated to both a photoanode and a photocathode for enhancing respective electron and hole carrier transfer.

Preferably, the photoanode may comprise a mesoporous n-type semiconducting material arranged on a transparent conductive substrate, plasmonic nanostructures integrated to an n-type semiconducting material acting as an electron acceptor material, and a dye sensitizer acting as an electron donor material; and the photocathode may comprises a mesoporous p-type semiconducting material arranged on the transparent conductive substrate, plasmonic nanostructures integrated to a p-type semiconducting material acting as a p-type semiconductor as the hole acceptor material, and a dye sensitizer acting as a hole donor material; the mesoporous n-type and p-type semiconducting materials may be in the form of layers, and the plasmonic nanostructures comprise a plurality of plasmonic nanoislands synthesized and integrated with the mesoporous semiconducting photoactive layers via physical vapor deposition (PVD) and then self-assembly thermal annealing.

Suitably, the dye sensitizer acting as an electron donor material may include a metal complex selected from a group including Ruthenium (Ru), Osmium (Os), Rhenium (Re), Platinum (Pt), Iron (Fe), Copper (Cu) and respective metal complexes derivatives thereof; and/or porphyrins, chlorophylls, phthalocyanines and respective derivatives thereof; and/or organic dyes selected from a group including coumarin dyes, indoline dyes, tetrahydroquinoline dyes, triarylamine dyes, heteroanthracene dyes, carbazole dyes, N,N-dialkylaniline dyes, hemicyanine dyes, merocyanine dyes, squaraine dyes, perylene dyes, anthraquinone dyes, boradiazaindacene dyes, oligothiophene dyes, polymeric dyes. The polymeric dyes may be selected from a group including polyaniline, polythiophenes, polypyrrole and respective derivatives thereof.

In an embodiment, the n-type semiconducting material acting as an electron acceptor material may include an n-type semiconducting metal oxide selected from a group including titanium oxides, zinc oxides, tungsten oxides, molybdenum oxides.

In one embodiment, the dye sensitizer acting as a hole donor material may include "push-pull" dyes with a carboxylic acid derivatized triarylamine core as the electron "push" moiety and electron accepting groups (e.g. di-/tri-cyanovinylene, 1,3-diethyl-2-thiobarbituric acid), and 2-(3,5,5-trimethylcyclohex-2-enylidene)-malononitrile acting as electron "pull" moiety.

In another embodiment, the dye sensitizer acting as a hole donor material may include "donor-sensitizer" dyes with a secondary electron acceptor (e.g. naphthalene diimide (NDI), fullerence ($C_{60}$), etc.) covalently appended to anchored chromophore moiety (e.g. carboxylic derivatized perylene monoimide unit (PMI)).

The dye sensitizer acting as a hole acceptor material may include a p-type semiconducting metal oxide. For example, the p-doped metal oxide may be p-doped zinc oxides or p-doped titanium oxides, or the p-type semiconductor material may include a metal oxide which may be selected from a group including nickel oxides, copper oxides, strontium copper oxides, strontium titanium oxides, aluminum copper oxides, gallium copper oxides.

At least one of the plasmonic nanostructures may include a metal selected from a group including gold, silver, copper, and aluminum; the plasmonic nanostructure may include a plurality of self-assembly nanoislands of gold, silver, copper, aluminum or combination thereof, the plasmonic nanostructure may include matrices of nanopillars of gold, silver, copper, aluminum, the plasmonic nanostructure may comprise matrices of nanoholes of gold, silver, copper, aluminum, and/or the plasmonic nanostructure may include metal-insulator nanoshells made of gold, silver, copper, aluminum with an insulator core made of silicon oxides, titanium oxides, zinc oxides.

The solar system may comprise a redox mediator between the photoanode and the photocathode, wherein the redox mediator may include liquid redox electrolytes, gel and polymer electrolytes, ionic liquid electrolytes, solid organic hole conductors, and inorganic solid hole conductors.

The n-type semiconducting layer may be disposed via a first liquid-based coating process onto the transparent conductive substrate, and the p-type semiconducting layer may be disposed via a second liquid-based coating process onto the transparent substrate. In a specific embodiment, the first or second liquid based coating process may be selected from a group of including solution coating, ink jet printing, spin coating, dip coating, knife coating, bar coating, spray coating, roller coating, slot coating, gravure coating, flexographic printing, or screen printing.

Preferably, the solar system may have an at least two-layer configuration, configured with tunable optical resonance for harvesting an entire AM1.5 solar spectrum, and comprising a repeater layer arranged between the at least two-layer configuration, wherein the repeater layer comprises a conductive polymer (e.g. poly(pyrrole)s, polyanilines, poly(acetylene)s, poly(p-phenylene vinylene) blended with metallic particles or graphene flakes); and/or metal oxide (e.g. fluorine-doped tin oxides, indium-doped tin oxides blended with metallic particles or graphene flakes).

According to a second aspect of the present invention, there is provided a photovoltaic system comprising plasmonic nanostructures integrated to a photoanode and a photocathode with a spectral absorption band different from that of the photoanode, wherein the photocathode is adapted to act as a secondary member for absorbing light not absorbed by the photoanode for increasing overall energy absorption efficiency of the photovoltaic system.

Preferably, the photovoltaic system may have a multi-layer structure, wherein the system may include multiple units of n-type/repeater/p-type semiconductor. The n-type semiconductor may be disposed by a first liquid-based coating process, the repeater layer may be disposed by a second liquid-based coating process, and/or the p-type photoactive layer may be disposed by a third liquid-based coating process, wherein the first, second or third liquid based coating process may include solution coating, ink jet printing, spin coating, dip coating, knife coating, bar coating, spray coating, roller coating, slot coating, gravure coating, flexographic printing, or screen printing.

In an embodiment, the system may have different spectral absorption band and may be integrated to intermediate photoactive layers having spectral absorption band different from that of the plasmonic nanostructures integrated to the first photoactive layer, for maximizing light absorption by the plasmonic nanostructures and the photoactive layers and thus efficiency.

According to a third aspect of the present invention, there is provided a method of manufacture of plasmonic nanostructure for use in a plasmonic enhanced tandem dye sensitized solar cell system, comprising a) self-assembly of nanoislands on mesoporous photoactive layers, b) formation of nanopillars matrices on a transparent conductive substrate by nanosphere lithography, c) formation of nanoholes matrices on a transparent conductive substrate by nanosphere lithography, and/or d) formation of metal-insulator nanoshells by the combination of molecular self-assembly and reduction chemistry.

The LSPR frequency of the self-assembly nanoisland may be determined by the nominal metal deposition thickness on top of the semiconductor, the formation temperature and the annealing time. For example, with increasing thickness of gold deposition from 3 nm to 9 nm then annealed at 450 degree Celsius for 10 hours results in observable change of the LSPR frequency as the maximum optical extinction wavelength shifts towards red.

The LSPR frequency of the plasmonic nanopillars matrix may be determined by the variation of inter-pillar spacing, the diameter of the nanopillars, and height of the nanopillars. These parameters may be controlled and determined during the nanosphere lithography process. The first crucial step is the initial assembly of the polystyrene nanosphere (PS) monolayer on the deionized water bath surface to create a well-ordered array then transfer it to the conductive glass substrate. The second step involves RIE using $O_2$ and $CHF_3$ gases. Thirdly, a thin layer of 10 nm chromium is evaporated onto the etched monolayer and wet etching with non-polar solvent toluene (Sigma Aldrich) at 40 degree Celsius is used to remove the PS without affecting the LOL1000 polymer. The fourth step is the evaporation of plasmonic metal onto the patterned glass substrate at high vacuum to prevent oxidation. The last liftoff step with AZ300 MIF solution removes the LOL1000 polymer with the chromium mask, leaving the plasmonic nanopillars matrices on top of the conductive transparent substrate. Thus, the three aforementioned crucial parameters: (1) the inter-pillar spacing is controlled by the drainage speed during monolayer transfer; (2) the final diameter of the nanopillar is determined primarily by the PS particle diameter in the first RIE step; and (3) the final height of the nanopillar is controlled by the LOL1000 polymer thickness. By controlling these parameters, LSPR frequency of nanopillars matrix can be tuned across the AM1.5 solar spectrum.

The LSPR frequency of the plasmonic nanoholes matrix may be determined by the variation of inter-hole spacing, the diameter of the nanohole, and thickness of the nanoholes layer. These parameters may be controlled and determined during the nanosphere lithography process. The first crucial step is the initial assembly of the polystyrene nanosphere (PS) monolayer on the deionized water bath surface to create a well-ordered array then transfer it to the conductive glass substrate. The second step involves RIE of the monolayer using $O_2$ gas. Thus, the diameter of the 100 nm PS is reduced to approximately 58 nm. Thirdly, plasmonic metal is evaporated onto the patterned glass substrate at vacuum of $5 \times 10^{-6}$ Torr or lower to prevent oxidation. Finally, RIE with 40 SCCM $O_2$ with 50 W for 5 minute is used to remove the PS, leaving nanoholes equals to the diameter of the PS on the conductive glass. The three aforementioned crucial parameters: (1) the inter-hole spacing is controlled by the drainage speed during monolayer transfer; (2) the final diameter of the nanohole is determined primarily by the PS particle diameter in the RIE step; and (3) the final thickness of the nanoholes layer is controlled by the final plasmonic metal deposition thickness and determined by the PS diameter after RIE. By controlling these parameters, LSPR frequency of nanoholes matrix can be tuned across the AM1.5 solar spectrum.

The LSPR frequency of the plasmonic nanoshells may be determined by the nanometer scale core diameter to shell thickness ratio. In order to control the core-shell ratio, combination of molecular self-assembly and reduction chemistry of metal colloid is employed. Organosilane molecules, for example 3-aminopropyltriethoxysilane (APTES), are chemically adsorbed onto the dielectric nanocore and extend their amine groups outward as a termination of the nanoparticle surface. A solution containing 1 nm to 2 nm gold colloid is added to the silane coated dielectric core. The gold particles are covalently bonded to the APTES linkage molecules via the amine group. Subsequence reduction with an aged mixture of chloroauric acid and potassium carbonate by a solution of sodium borohydride, where the gold-seeded silica nanoparticles are used as the nucleation sites for reduction, results in the increase of gold coverage on the nanoparticle surface. Thus, thickness of the gold nanoshell can be adjusted experimentally and the LSPR frequency of nanoshells can be tuned across the AM1.5 solar spectrum.

BRIEF DESCRIPTION OF THE DRAWINGS

Some embodiments of the present invention will now be explained, with reference to the accompanied drawings, in which:—

DETAILED DESCRIPTION OF PREFERRED EMBODIMENTS OF THE PRESENT INVENTION

Figure 1A:
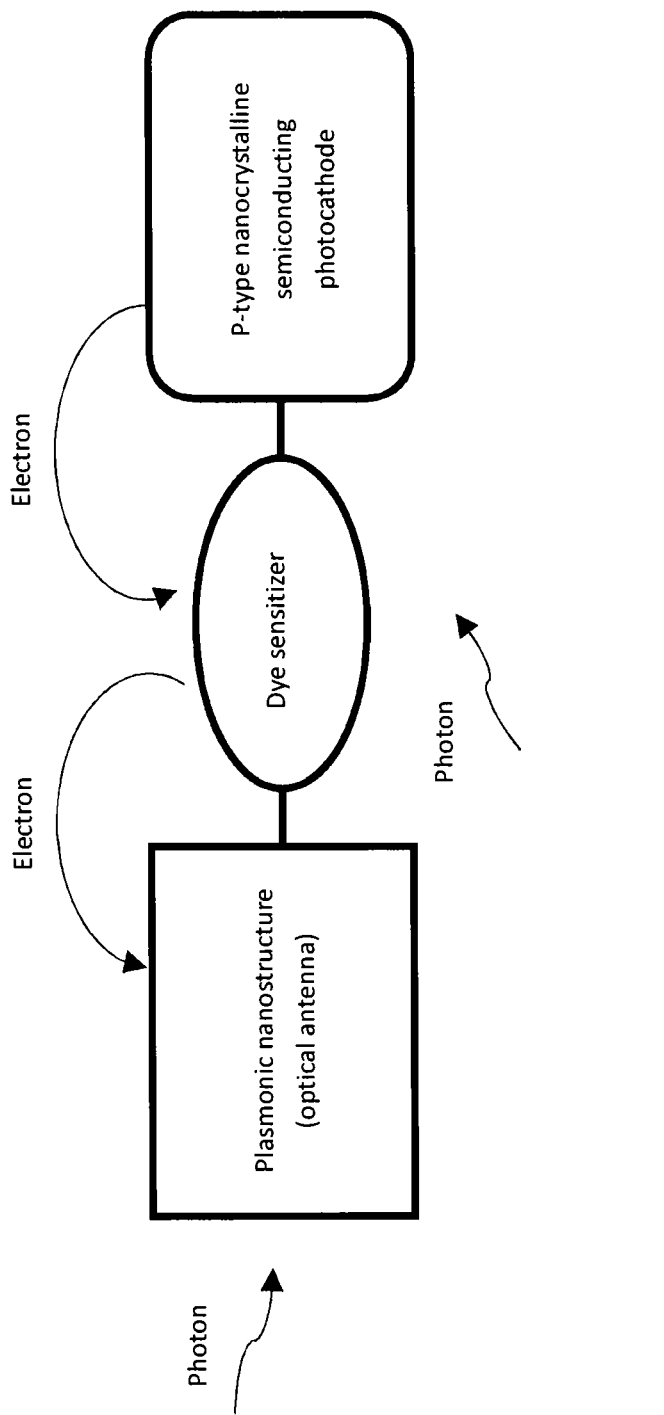
FIG. 1a shows the schematic of an embodiment of plasmonic nanostructure as optical antenna for a dye sensitizer molecule adsorbed to an n-type nanocrystalline photoanode with explicit path of photon-to-electron transfer.

The present invention discloses plasmonic enhanced tandem dye-sensitized solar cell with metallic nanostructures, and method of manufacture thereof.

Studies have shown that tandem dye-sensitized solar cell (TDSSC) is a novel approach for a cost effective renewable energy source with theoretical conversion efficiency over 40%. This conversation efficiency is significantly higher than the recent record of 13% with non-tandem DSSC devices.

Metallic nanostructures of 10 nm to 100 nm can absorb visible light 100-1000× more efficiently than many dyes. According, the plasmonic absorption can be tuned for every specific region of the AM1.5 spectrum via nanoengineering. Such high absorption apparently is the result of localized surface plasmon resonance (LSPR) which is also responsible for the surface enhanced Raman scattering (SERS) effect. Therefore, plasmonic nanostructures can be regarded as optical antennas operating in the visible range of the electromagnetic spectrum. As incoming light is received by the antenna, free space propagating photon excites collective oscillation of electron at the frequency of the incident optical radiation. If the excitation is at a resonant frequency, the charge oscillation results in a plasmon polariton with much reduced wavelength, so energy is confined in this plasmon mode as an intense field in the immediate vicinity of the antenna. This field efficiently couples to the electronic excitation of the dye molecules as the SERS effect, thus provides a more efficient pathway to electronically excite dye molecules from the incident radiation. Consequently, plasmonic enhancement is preferable to both dye-sensitized photoanode and photocathode of the proposed tandem cell.

In the present invention, the plasmonic enhancement schemes for tandem dye-sensitized photovoltaic cell using metallic nanostructures are illustrated. In one aspect, the present invention is concerned with an elementary tandem cell includes a photoanode consisting of a charge accepting wide-band-gap nanocrystallized n-type semiconductor; a photocathode consisting of a hole accepting wide-band-gap nanocrystallized p-type semiconductor; metallic nanostructures capable of localized plasmonic resonance in contact with dye molecules adsorbed on both photoactive electrodes; and a charge shuttling redox mediator in between photoactive electrodes. Another aspect of the present invention is concerned with a plurality of nanocrystallized semiconductors; dye sensitizer coatings chemically adsorbed onto a plurality of semiconductors; and a plurality of plasmonic nanostructures in contact with both sensitizer coatings and semiconductor nanocrystals. A further aspect of the present invention is concerned with metallic nanostructures engineering which aids to harvest every component of the AM1.5 spectrum with plasmonic effect for a novel and more efficient photovoltaic cell. The techniques used include synthesis of self-assembly nanoisland via thermal annealing of PVD deposited ultrathin metallic film; fabrication of patterned metallic nanopillars and nanoholes matrices via nanosphere lithography; and formation of metal-insulator nanoshell via chemical synthesis. Yet a further aspect of the present invention is concerned with cell assembly which includes dye staining of plasmonic enhanced photoactive electrodes with corresponding dye molecules, formation of cell chamber by sealing of two photoactive electrodes, followed by injection of a redox mediator, and subsequently capping of a completed cell.

Embodiments can include one or more of the following features:

In some embodiments, the transparent conductive electrode can be a piece of glass coated with rare-earth-metal doped oxide. For example, it can be indium-doped tin oxide (ITO) or fluorine-doped tin oxide (FTO). Glass with low sheet resistance is generally preferred for high performance TDSSC application.

In some embodiment, one of the photoactive layers includes an n-type semiconductor material which functions as the photoanode; another photoactive layer includes a p-type semiconductor material which functions as the photocathode.

In some embodiment, the electron-hole transporting repeater includes a conductive polymer. For example, the conductive polymer can be selected from poly(pyrrole)s, polyanilines, poly(acetylene)s, poly(p-phenylene vinylene).

In certain embodiments, the repeater layer comprises metallic particles. In certain embodiments, the repeater layer comprises graphene flakes.

In some embodiment, the electron-hole transporting repeater includes a metal oxide. For example, the metal oxide can be selected from titanium oxides, tin oxides, zinc oxides, indium-doped tin oxides, and combination thereof. In certain embodiments, the repeater layer comprises metallic particles. In certain embodiments, the repeater layer comprises graphene flakes.

In some embodiment, the n-type semiconductor material includes a metal oxide. For example, the metal oxide can be selected from titanium oxides, zinc oxides, tungsten oxides, molybdenum oxides, and combinations thereof.

In some embodiment, the p-type semiconductor material includes a p-doped metal oxide. For example, the p-doped metal oxide can be p-doped zinc oxides or p-doped titanium oxides. In certain embodiment, the p-type semiconductor material includes a metal oxide. For example, the metal oxide can be selected from nickel oxides, copper oxides, strontium copper oxides, strontium titanium oxides, aluminum copper oxides, gallium copper oxides, and combination thereof.

In some embodiment, the plasmonic nanostructure can synthesized using metals includes gold, silver, copper, and aluminum.

In some embodiment, the plasmonic nanostructure includes a plurality of self-assembly nanoislands of gold, silver, copper, aluminum or combination thereof.

In some embodiment, the plasmonic nanostructure includes matrices of nanopillars of gold, silver, copper, aluminum.

In some embodiment, the plasmonic nanostructure includes matrices of nanoholes of gold, silver, copper, aluminum.

In some embodiment, the plasmonic nanostructure includes metal-insulator nanoshells. The metal shell is made of gold, silver, copper, aluminum. The insulator core is made of silicon oxides, titanium oxides, zinc oxides.

In some embodiment, the dye sensitizer applied to the n-type semiconducting mesoporous photoactive layer includes metal complexes selected from Ruthenium (Ru), Osmium (Os), Rhenium (Re), Platinum (Pt), Iron (Fe), Copper (Cu) and respective metal complexes derivatives thereof.

In some embodiment, the dye sensitizer applied to the n-type semiconducting mesoporous photoactive layer includes porphyrins, chlorophylls, phthalocyanines and respective derivatives thereof.

In some embodiment, the dye sensitizer applied to the n-type semiconducting mesoporous photoactive layer includes organic dyes selected from coumarin dyes, indoline dyes, tetrahydroquinoline dyes, triarylamine dyes, heteroanthracene dyes, carbazole dyes, N,N-dialkylaniline dyes, hemicyanine dyes, merocyanine dyes, squaraine dyes, perylene dyes, anthraquinone dyes, boradiazaindacene dyes, oligothiophene dyes, polymeric dyes (e.g. polyaniline, polythiophenes, polypyrrole, etc.) and respective derivatives thereof.

In some embodiment, the dye sensitizer applied to the p-type semiconducting mesoporous photoactive layer includes "push-pull" dyes with a carboxylic acid derivatized triarylamine core as the electron "push" moiety and various electron accepting groups such a di-/tri-cyanovinylene, 1,3-diethyl-2-thiobarbituric acid, and 2-(3,5,5-trimethylcyclohex-2-enylidene)-malononitrile as the electron "pull" moiety.

In some embodiment, the dye sensitizer applied to the p-type semiconducting mesoporous photoactive layer includes "donor-sensitizer" dyes with a secondary electron acceptor (e.g. naphthalene diimide (NDI), fullerence ($C_{60}$), etc.) covalently appended to the anchored chromophore moiety (e.g. carboxylic derivatized perylene monoimide unit (PMI)).

In some embodiment, the redox shuttling mediator includes liquid redox electrolytes, gel and polymer electrolytes, ionic liquid electrolytes, solid organic hole conductors, and inorganic solid hole conductors.

In some embodiment, the n-type photoactive layer is disposed via the first liquid-based coating process onto the transparent conductive oxide glass; the p-type photoactive layer is disposed via the second liquid-based coating process onto the transparent conductive oxide glass. The first or second liquid based coating process can include solution coating, ink jet printing, spin coating, dip coating, knife coating, bar coating, spray coating, roller coating, slot coating, gravure coating, flexographic printing, or screen printing.

In some embodiment, the photovoltaic system further includes an n-type/repeater/p-type unit. The n-type semiconductor is disposed by liquid-based coating process; the repeater layer is disposed by the second liquid-based coating process; the p-type photoactive layer is disposed by the third liquid-based coating process. The first or second or third liquid based coating process can include solution coating, ink jet printing, spin coating, dip coating, knife coating, bar coating, spray coating, roller coating, slot coating, gravure coating, flexographic printing, or screen printing.

In some embodiment, the plasmonic nanostructures integrated to the photoanode layer have different spectral absorption band to the plasmonic nanostructure integrated to the photocathode. Thus, light not absorbed by the first photoanode can be absorbed by the second photocathode, thereby increasing the efficiency of the photovoltaic cell.

In some embodiment, the plasmonic nanostructures integrated to the photoanode layer have different spectral absorption band to the plasmonic nanostructure integrated to the intermediate repeater layers. The spectral absorption band of plasmonic nanostructures integrated to each intermediate repeater layer is also distinctive from one another. The plasmonic nanostructures integrated to the photocathode layer also have different spectral absorption band to the plasmonic nanostructure integrated to the intermediate repeater layers. Thus, light not absorbed by one layer can be absorbed by the following layers in the system, thereby increasing the total efficiency of the photovoltaic cell.

In some embodiment, an inorganic photoactive layer can be used as a window layer to remove UV light or the deep blue portion of the AM1.5 solar spectrum, which can damage the dye sensitizer of the photovoltaic system.

The details of one or more embodiments of the invention are set forth in the accompanying drawings and description below. Other features, objects, and advantages of the invention will be apparent from the description, drawings, and the claims.

During the course leading to the present invention, the effect of plasmonic enhancement to dye-sensitized solar cells was studied. FIG. 1a illustrates a simplified sequence of dye-sensitized photocurrent generation in an n-type semiconductor/dye/metal nanostructure case. The n-type semiconductor chosen is typically a wide band gap material, e.g. anatase titanium dioxide of 3.2 eV, wurzrite zinc oxide of 3.4 eV, etc. The dye sensitizer molecules are metal complexes selected from Ruthenium (Ru), Osmium (Os), Rhenium (Re), Platinum (Pt), Iron (Fe), or Copper (Cu). Typical dye sensitizer demonstrated is, not limited to, cis-diisothiocyanato-bis(2,2'-bipyridyl-4,4'-dicarboxylato) ruthenium(II) bis(tetrabutylammonium) which is known as N-719. The plasmonic nanostructures are made of Gold (Au), Silver (Ag), Copper (Cu) or Aluminum (Al). The electron transfer from the excited dye into n-type semiconductor involves a combination of two mechanisms. In the first mechanism the dye molecule absorbs a photon, thus an electron is promoted from the highest occupied molecular orbital (HOMO) band to the lowest unoccupied molecular orbital (LUMO) band of the molecule. This is known as "hot" electron and it is transported to the conduction band (CB) of the n-type semiconductor. The second mechanism involves two steps: (1) the plasmonic nanostructure acts as an optical antenna and converts incoming photon into localized surface plasmon polaritons with much enhanced near-field energy concentration; (2) electrons accumulate in the n-type semiconductor-dye-metal nanocrystalline boundary as the excited state "hot" electron lifetime matches those of the surface plasmon polariton, transport of electrons from the dye sensitizer to the n-type semiconductor is much enhanced. A plurality of these individual units functions as the photoanode.

In certain embodiments, the dye sensitizer can be porphyrins, chlorophylls, phthalocyanines and respective derivatives instead. In certain embodiment, the dye sensitizer can be organic dyes selected from coumarin dyes, indoline dyes, tetrahydroquinoline dyes, triarylamine dyes, heteroanthracene dyes, carbazole dyes, N,N-dialkylaniline dyes, hemicyanine dyes, merocyanine dyes, squaraine dyes, perylene dyes, anthraquinone dyes, boradiazaindacene dyes, oligothiophene dyes, polymeric dyes (e.g. polyaniline, polythiophenes, polypyrrole, etc.) and respective derivatives.

Figure 1B:
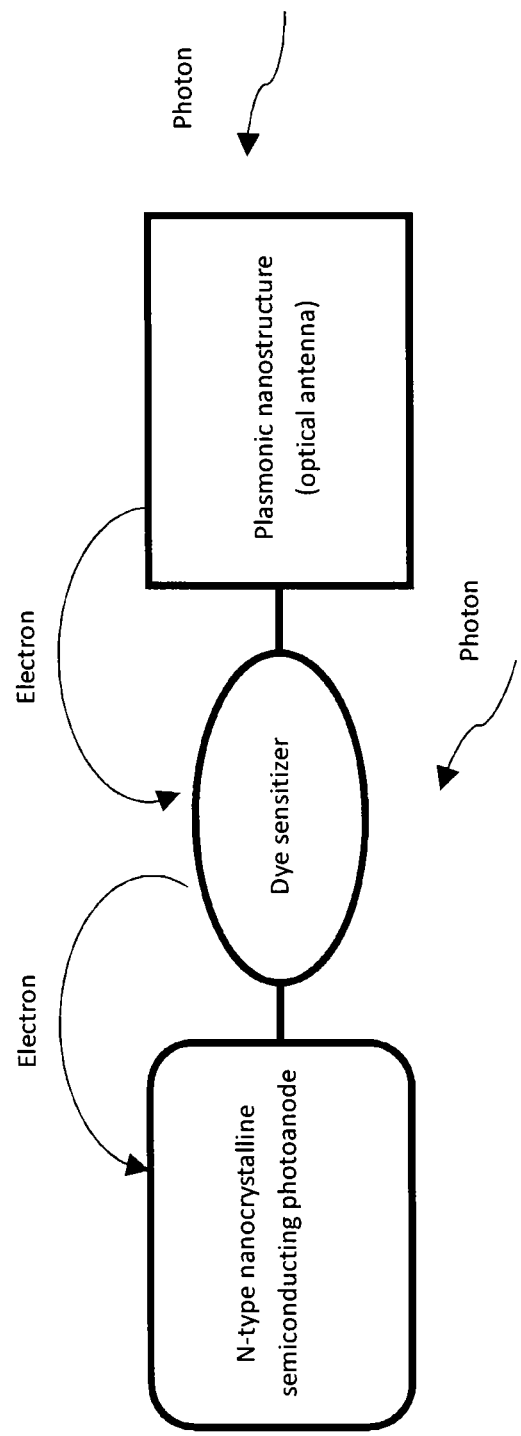
FIG. 1b shows the schematic of an embodiment of plasmonic nanostructure as optical antenna for a dye sensitizer molecule adsorbed to a p-type nanocrystalline photocathode with explicit path of photon-to-electron transfer.

FIG. 1b illustrates a simplified sequence of dye-sensitized photocurrent generation in a metal/dye/p-type semiconductor nanostructure case. The p-type semiconductor can be copper oxides, strontium copper oxides, strontium titanium oxides, aluminum copper oxides, gallium copper oxides, or combination of these metal oxides. P-type semiconductor can also be metal oxides after doping with a dopant, e.g. p-doped zinc oxides or p-doped titanium oxides. Examples of dopants include salts or acids of fluoride, chloride, bromide, and iodide. The dye sensitizer molecules "push-pull" dyes with a carboxylic acid derivatized triarylamine core as the electron "push" moiety and various electron accepting groups such a di-/tri-cyanovinylene, 1,3-diethyl-2-thiobarbituric acid, and 2-(3,5,5-trimethylcyclohex-2-enylidene)-malononitrile as the electron "pull" moiety. The plasmonic nanostructures are made of Gold (Au), Silver (Ag), Copper (Cu) or Aluminum (Al). The hole transfer from the excited dye into p-type semiconductor involves a combination of two mechanisms. In the first mechanism the dye molecule absorbs a photon, thus an electron is promoted from the highest occupied molecular orbital (HOMO) band to the lowest unoccupied molecular orbital (LUMO) band of the molecule. This is known as electron-hole pair separation and the hole is transported and injected to the valence band (VB) of the p-type semiconductor. The second mechanism involves two steps: (1) the plasmonic nanostructure acts as an optical antenna and converts incoming photon into localized surface plasmon polaritons with much enhanced near-field energy concentration; (2) electrons accumulate in the p-type semiconductor-dye-metal nanocrystalline boundary as the excited state electron-hole pair lifetime matches those of the surface plasmon polariton, transport of the hole from the dye sensitizer to the p-type semiconductor is promoted. A plurality of these individual units functions as the photocathode.

In certain embodiments, the dye sensitizer applied to the p-type semiconducting mesoporous photocathode can be "donor-sensitizer" dyes with a secondary electron acceptor (e.g. naphthalene diimide (NDI), fullerence ($C_{60}$), etc.) covalently appended to the anchored chromophore moiety (e.g. carboxylic derivatized perylene monoimide unit (PMI)).

Figure 2A:
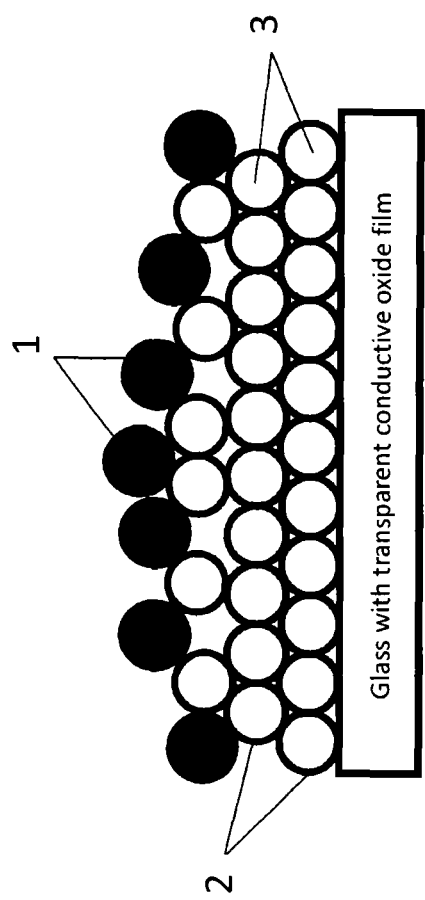
FIG. 2a shows the schematic of an embodiment of plasmonic self-assembly nanoisland integrated to a photoactive nanocrystalline semiconductor.

FIG. 2a illustrates the plasmonic configuration with self-assembly nanoisland applied to the photoanode. The synthesis procedure includes: (1) the nanocrystalline n-type semiconductor 1 is disposed via a first liquid based coating process onto a transparent conductive film over a glass substrate; (2) the nanocrystalline photoanode is sintered at recommended temperature to form an interconnected network of mesoporous film for electron transfer; (3) a thin layer of plasmonic supporting metal, i.e. with nominal thickness of a few nanometer, is deposited onto the photoanode via the PVD methods, e.g. vacuum thermal evaporation or magnetron sputtering; (4) the metal coated photoanode is annealed at elevated temperature to enable self-assembly clustering of nanoislands 2 with dimensions in tens of nanometers; (5) the completed photoanode is stained with a dye sensitizer solution and the dye molecules form a sensitizing layer 3 over the nanocrystalline n-type semiconductor.

In certain embodiments, the plasmonic configuration of self-assembly nanoisland is also applied to the photocathode. The synthesis procedure is similar to the photoanode except that the n-type semiconductor is being replaced by a p-type counterpart which includes metal oxides selected from nickel oxides, copper oxides, strontium copper oxides, strontium titanium oxides, aluminum copper oxides, gallium copper oxides, or combination thereof. In some embodiments, the n-type semiconductor is also replaced by p-doped zinc oxides or p-doped titanium oxides with dopants including salts or acids of fluoride, chloride, bromide, and iodide. The p-type dye-sensitizer also differs from those of n-type. Dyes include: (1) "push-pull" types with a carboxylic acid derivatized triarylamine core as the electron "push" moiety and various electron accepting groups such a di-/tri-cyanovinylene, 1,3-diethyl-2-thiobarbituric acid, and 2-(3,5,5-trimethylcyclohex-2-enylidene)-malononitrile as the electron "pull" moiety; (2) "donor-sensitizer" types with a secondary electron acceptor (e.g. naphthalene diimide (NDI), fullerence ($C_{60}$), etc.) covalently appended to the anchored chromophore moiety (e.g. carboxylic derivatized perylene monoimide unit (PMI)). Although the semiconductor and dye are different for photocathode, the synthesis of plasmonic nanoisland on the photocathode is the same as the photoanode.

Figure 2B:
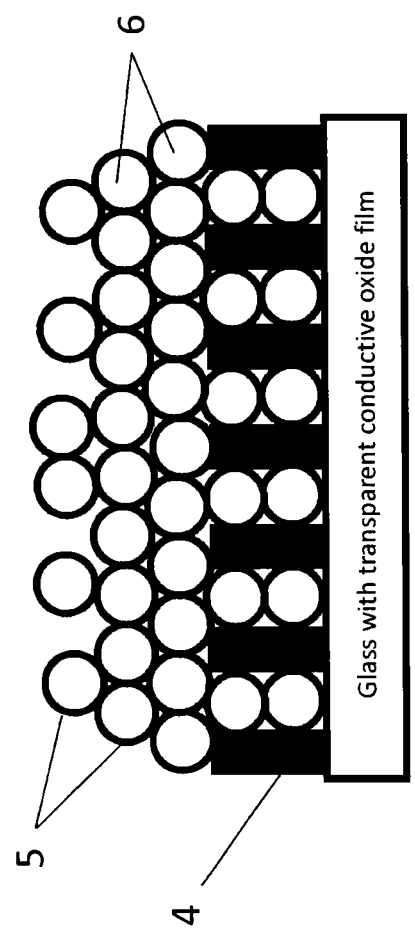
FIG. 2b shows the schematic of an embodiment of plasmonic nanopillars matrices integrated to a photoactive nanocrystalline semiconductor.

FIG. 2b illustrates the plasmonic configuration with nanopillars matrices 4 applied to the photoanode. The synthesis of nanopillars involves nanosphere lithography method with double-liftoff (HP lab report) including: (1) formation of polystyrene nanosphere (100-300 nm diameter, Duke Scientific) monolayer at air-water interface; (2) transfer of monolayer to LOL1000 (Shipley Ltd) coated transparent conductive oxide coated glass (7 ohm/square, Corning); (3) reactive ion etching (RIE) of the polystyrene nanospheres to set the final nanopillar diameter; (4) 10 nm chromium evaporation and liftoff by dissolving nanospheres in toluene at 40 degree Celsius; (5) RIE of LOL1000 through chromium mask; (6) evaporation of plasmonic supporting metal and liftoff by dissolving LOL1000 in AZ 300 MIF developer (AZ Electronic Materials). The nanopillars matrices are formed on the conductive glass substrate. The nanocrystalline n-type semiconductor 5 is disposed via the first liquid based coating process over the nanopillars matrices on conductive glass. The nanocrystalline photoanode is sintered at recommended temperature to form an interconnected network of mesoporous film for electron transfer. The completed photoanode is stained with a dye sensitizer solution and the dye molecules form a sensitizing layer 6 over the nanocrystalline n-type semiconductor.

In some embodiments, the plasmonic configuration of nanopillars matrices is also applied to the photocathode. The synthesis procedure is similar to the photoanode except that the n-type semiconductor is being replaced by a p-type counterpart which includes metal oxides selected from nickel oxides, copper oxides, strontium copper oxides, strontium titanium oxides, aluminum copper oxides, gallium copper oxides, or combination thereof. In certain embodiment, the n-type semiconductor is being also replaced by p-doped zinc oxides or p-doped titanium oxides with dopants include salts or acids of fluoride, chloride, bromide, and iodide. The p-type dye-sensitizer also differs from those of n-type. Dyes include: (1) "push-pull" types with a carboxylic acid derivatized triarylamine core as the electron "push" moiety and various electron accepting groups such a di-/tri-cyanovinylene, 1,3-diethyl-2-thiobarbituric acid, and 2-(3,5,5-trimethylcyclohex-2-enylidene)-malononitrile as the electron "pull" moiety; (2) "donor-sensitizer" types with a secondary electron acceptor (e.g. naphthalene diimide (NDI), fullerence ($C_{60}$), etc.) covalently appended to the anchored chromophore moiety (e.g. carboxylic derivatized perylene monoimide unit (PMI)). Although the semiconductor and dye are different for photocathode, the synthesis of plasmonic nanopillars matrices on the photocathode is the same as the photoanode.

Figure 2C:
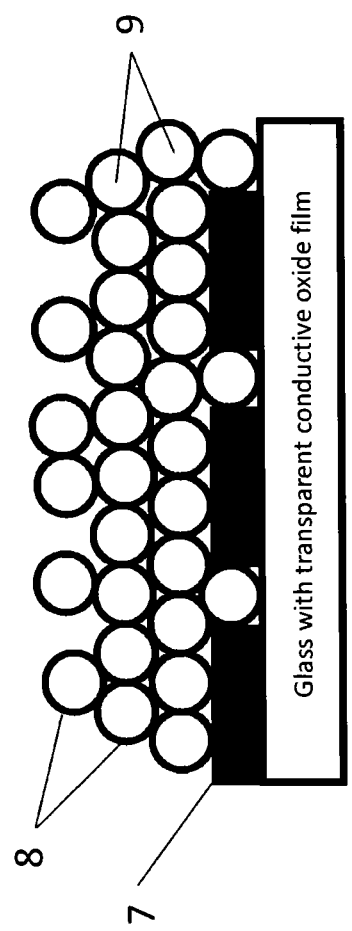
FIG. 2c shows the schematic of an embodiment of plasmonic nanoholes matrices integrated to a photoactive nanocrystalline semiconductor.

FIG. 2c illustrates the plasmonic configuration with nanoholes matrices 7 applied to the photoanode. The synthesis of nanoholes involves nanosphere lithography method including: (1) formation of polystyrene nanosphere (100-300 nm diameter, Duke Scientific) monolayer at air-water interface; (2) transfer of monolayer to transparent conductive oxide coated glass (7 ohm/square, Corning); (3) reactive ion etching (RIE) of the polystyrene nanospheres to set the final nanohole diameter; (4) evaporation of plasmonic supporting metal and thermal annealing to remove the polystyrene nanospheres. Thus, the nanoholes matrices are formed on the conductive glass substrate. The nanocrystalline n-type semiconductor 8 is disposed via the first liquid based coating process over the nanoholes matrices on conductive glass. The nanocrystalline photoanode is sintered at recommended temperature to form an interconnected network of mesoporous film for electron transfer. The completed photoanode is stained with a dye sensitizer solution and the dye molecules form a sensitizing layer 9 over the nanocrystalline n-type semiconductor.

In some embodiments, the plasmonic configuration of nanoholes matrices is also applied to the photocathode. The synthesis procedure is similar to the photoanode except that the n-type semiconductor is being replaced by a p-type counterpart which includes metal oxides selected from nickel oxides, copper oxides, strontium copper oxides, strontium titanium oxides, aluminum copper oxides, gallium copper oxides, or combination thereof. In certain embodiment, the n-type semiconductor is being also replaced by p-doped zinc oxides or p-doped titanium oxides with dopants include salts or acids of fluoride, chloride, bromide, and iodide. The p-type dye-sensitizer also differs from those of n-type. Dyes include: (1) "push-pull" types with a carboxylic acid derivatized triarylamine core as the electron "push" moiety and various electron accepting groups such a di-/tri-cyanovinylene, 1,3-diethyl-2-thiobarbituric acid, and 2-(3,5,5-trimethylcyclohex-2-enylidene)-malononitrile as the electron "pull" moiety; (2) "donor-sensitizer" types with a secondary electron acceptor (e.g. naphthalene diimide (NDI), fullerence ($C_{60}$), etc.) covalently appended to the anchored chromophore moiety (e.g. carboxylic derivatized perylene monoimide unit (PMI)). Although the semiconductor and dye are different for photocathode, the synthesis of plasmonic nanoholes matrices on the photocathode is the same as the photoanode.

Figure 2D:
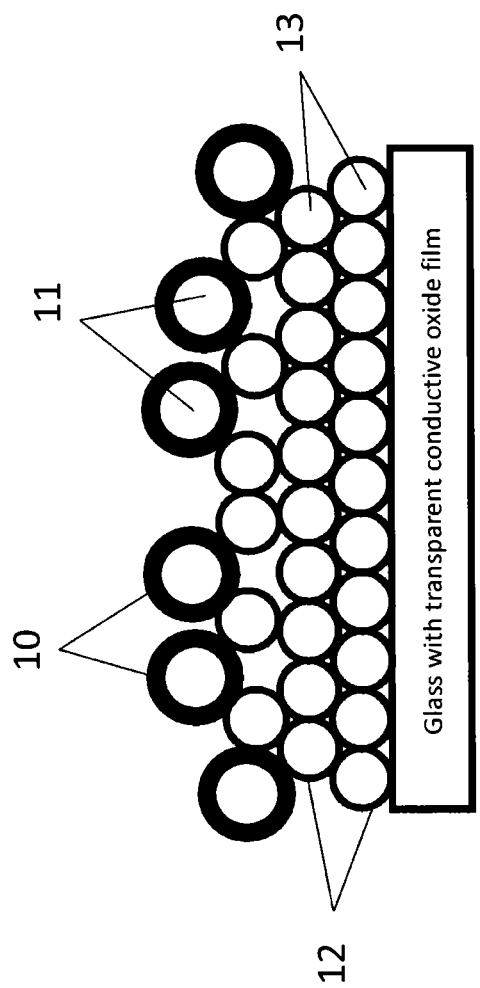
FIG. 2d shows the schematic of an embodiment of plasmonic metal-insulator nanoshells integrated to the integrated to a photoactive nanocrystalline semiconductor.

FIG. 2d illustrates the plasmonic configuration with nanoshells 10 applied to the photoanode. The synthesis of nanoshells involves chemical method [5] including: (1) formation of dispersive silica spherical nanocores 11 suspension (100-300 nm diameter, Duke Scientific); (2) adsorption of organosilane molecules (3-Aminopropyltriethoxysilane, Sigma-Aldrich) to the silica nanocores via chemical reaction; (3) isolation of the silane coated silica nanocores from residual reactants; (4) addition of very small metal colloid (1-2 nm in diameter, nanoComposix) solution so metal particles are bonded covalently to the linkage silane molecules via the amine group; (5) thickness of the nanoshell is determined by the metal colloid concentration and the reaction time. The nanocrystalline n-type semiconductor 12 is disposed via the first liquid based coating process over the nanoholes matrices on conductive glass. Then, the nanoshells 10 are disposed onto the mesoporous semiconductor. The nanocrystalline photoanode is sintered at recommended temperature to form an interconnected network of mesoporous film for electron transfer. The completed photoanode is stained with a dye sensitizer solution and the dye molecules form a sensitizing layer 13 over the nanocrystalline n-type semiconductor.

In some embodiments, the plasmonic configuration of nanoshells is also applied to the photocathode. The synthesis procedure is similar to the photoanode except that the n-type semiconductor is being replaced by a p-type counterpart which includes metal oxides selected from nickel oxides, copper oxides, strontium copper oxides, strontium titanium oxides, aluminum copper oxides, gallium copper oxides, or combination thereof. In certain embodiment, the n-type semiconductor is being also replaced by p-doped zinc oxides or p-doped titanium oxides with dopants include salts or acids of fluoride, chloride, bromide, and iodide. The p-type dye-sensitizer also differs from those of n-type. Dyes include: (1) "push-pull" types with a carboxylic acid derivatized triarylamine core as the electron "push" moiety and various electron accepting groups such a di-/tri-cyanovinylene, 1,3-diethyl-2-thiobarbituric acid, and 2-(3,5,5-trimethylcyclohex-2-enylidene)-malononitrile as the electron "pull" moiety; (2) "donor-sensitizer" types with a secondary electron acceptor (e.g. naphthalene diimide (NDI), fullerence ($C_{60}$), etc.) covalently appended to the anchored chromophore moiety (e.g. carboxylic derivatized perylene monoimide unit (PMI)). Although the semiconductor and dye are different for photocathode, the synthesis of plasmonic nanoshells on the photocathode is the same as the photoanode.

Figure 3:
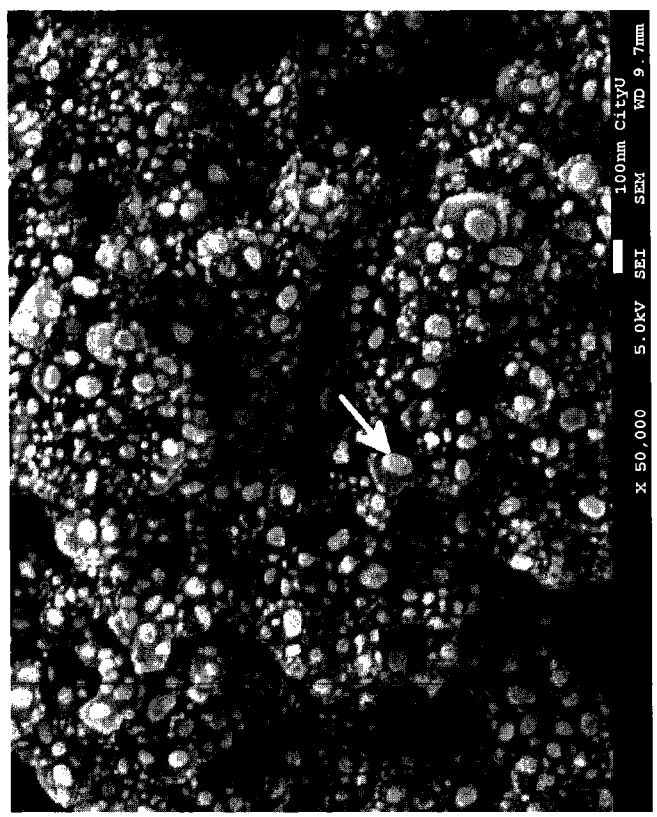
FIG. 3 is a photographic representation from a scanning electron microscope showing an embodiment of plasmonic self-assembly nanoisland integrated to a $TiO_2$ nanocrystalline semiconductor.

FIG. 3 demonstrates the self assembly nanoisland with 9 nm nominal thickness of gold and annealed at 450 degree Celsius over the mesoporous $TiO_2$ film, the self-assembly nanoisland formed is generally within 100 nm.

Figure 4:
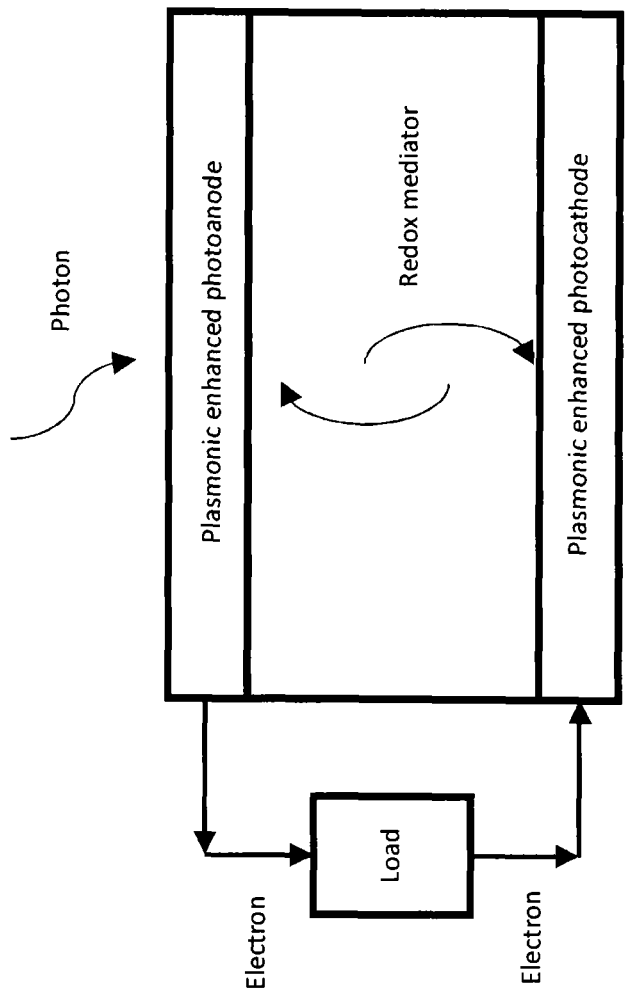
FIG. 4 shows the schematic of an embodiment of an elementary plasmonic enhanced tandem dye-sensitized solar cell.

FIG. 4 shows a tandem dye-sensitized solar cell (TDSSC) having two semi-cells. The first semi-cell includes a plasmonic enhanced photoanode in contact with the redox mediator. The photoanode can be selected from one of the configurations of FIG. 2. The second semi-cell includes a plasmonic enhanced photocathode in contact with the redox mediator. The photocathode can be also selected from one of the configurations of FIG. 2. The plasmonic configuration on photoanode and photocathode needs not to be identical, so different configurations can be combined in the same TDSSC cell. The photoanode contains an n-type semiconducting material which selectively transports electrons which act as the charge carrier. The photocathode contains a p-type semiconducting material which selectively transports holes which act as the charge carrier. In this configuration, the photoanode semi-cell absorbs photon and converts it into electrical form via dye-sensitized electron injection into the n-type semiconductor. The electron-depicted dye molecule is regenerated by the redox mediator. The photoanode generated open-circuit voltage is determined by the voltage difference between the redox mediator and the n-type conduction band against the normal hydrogen electrode (NHE). The photoanode generated short-circuit current is determined by the total electron injection by the dye sensitizer. Plasmonic enhancement aids to increase the efficiency of electron injection, thus boosting the short-circuit current, yet without impairing the photoanode open-circuit voltage. On the other hand, the photocathode semi-cell absorbs photon and converts it into electrical form via dye-sensitized hole injection into the p-type semiconductor. The hole-depicted dye molecule is regenerated by the redox mediator. The photocathode generated open-circuit voltage is determined by the voltage difference between the redox mediator and the p-type valence band against the normal hydrogen electrode (NHE). The photocathode generated short-circuit current is determined by the total hole injection by the dye sensitizer. Plasmonic enhancement aids to increase the efficiency of hole injection, thus boosting the short-circuit current, yet without impairing the photocathode open-circuit voltage. As a result, the TDSSC total open-circuit voltage is the sum of the photoanode open-circuit voltage plus the photocathode open-circuit voltage. The TDSSC total short-circuit current is the sum of the photoanode generated current plus the photocathode generated current.

In certain embodiment, the plasmonic configuration on the photoanode and photocathode differs to maximize photon harvesting efficiency of the TDSSC across the AM1.5 solar spectrum. The plasmonic configuration of photoanode is adjusted so that the LSPR frequency is tuned from 500 nm to 700 nm, whereas the plasmonic configuration of photocathode is adjusted so that the LSPR frequency is tuned from 800 nm to 1000 nm. Thus, the photoanode exhibits maximum photon absorption in the short wavelengths and acts as a band-pass filter, whereas the photocathode exhibits maximum photon absorption in the long wavelengths and acts as the complementary photon absorber to the photoanode.

In some embodiment, the LSPR frequency of the self-assembly nanoisland is determined by the nominal metal deposition thickness on top of the semiconductor. For example, with deposition of 3 nm, 5 nm, 7 nm, 9 nm and 11 nm of gold by thermal evaporation then annealed at 450 degree Celsius for 10 hours results in observable change of the LSPR frequency as the maximum optical extinction wavelength shifts.

In some embodiment, the LSPR frequency of the plasmonic nanopillars matrix is determined by the variation of inter-pillar spacing, the diameter of the nanopillars, and height of the nanopillars. These parameters are controlled and determined during the nanosphere lithography process. The first crucial step is the initial assembly of the polystyrene nanosphere (PS) monolayer on the deionized water bath surface to create a well-ordered array then transfer it to the conductive glass substrate, which includes: (1) preparation of ethanol to 4% by weight colloidal PS solution with ratio 3:2 for 100 nm PS and 1:1 for 300 nm PS; (2) adding trace amount of polyethylene oxide (Sigma Aldrich) to bind the PS together as they assemble; (3) the PS solution is sonicated for 1 minute so the resultant solution has lower density than water; (4) a transparent conductive glass spincoated with LOL1000 polymer and soaked with surfactant sodium dodecyl sulfate is submerged in a deionized water bath; (5) the sonicated PS solution is continuously dispensed onto the water bath surface forming the PS monolayer; (6) the monolayer is transfer to the glass substrate by draining the water bath in a controlled rate of 4 ml/min. The second step involves RIE using $O_2$ and $CHF_3$ gases. Flow rate of 40 standard-state cubic centimeter per minute (SCCM) of $O_2$ and 4 SCCM of $CHF_3$ with 30 W radio frequency power is applied for 3 minute. Thus, the diameter of the 100 nm PS is reduced to approximately 58 nm. With the inclusion of $CHF_3$ gas, undercutting of the LOL1000 polymer layer is reduced ensuring the successful liftoff step that follows. Thirdly, a thin layer of 10 nm chromium is evaporated onto the etched monolayer and wet etching with non-polar solvent toluene (Sigma Aldrich) at 40 degree Celsius is used to remove the PS without affecting the LOL1000 polymer. RIE with 40 SCCM $O_2$ with 50 W for 5 minute is used to etch through the LOL1000 template to the conductive glass substrate below, leaving nanoholes equals to the diameter of the removed PS. The final step is evaporated plasmonic metal onto the patterned glass substrate at vacuum of $5 \times 10^{-6}$ Torr or lower to prevent oxidation. The last liftoff step with AZ300 MIF solution removes the LOL1000 polymer with the chromium mask, leaving the plasmonic nanopillars matrices on top of the conductive glass substrate. The three aforementioned crucial parameters: (1) the inter-pillar spacing is controlled by the drainage speed during monolayer transfer; (2) the final diameter of the nanopillar is determined primarily by the PS particle diameter in the first RIE step; and (3) the final height of the nanopillar is controlled by the LOL1000 polymer thickness. By controlling these parameters, LSPR frequency of nanopillars matrix can be tuned across the AM1.5 solar spectrum.

In some embodiment, the LSPR frequency of the plasmonic nanoholes matrix is determined by the variation of inter-hole spacing, the diameter of the nanohole, and thickness of the nanoholes layer. These parameters are controlled and determined during the nanosphere lithography process. The first crucial step is the initial assembly of the polystyrene nanosphere (PS) monolayer on the deionized water bath surface to create a well-ordered array then transfer it to the conductive glass substrate, which includes: (1) preparation of ethanol to 4% by weight colloidal PS solution with ratio 3:2 for 100 nm PS and 1:1 for 300 nm PS; (2) adding trace amount of polyethylene oxide (Sigma Aldrich) to bind the PS together as they assemble; (3) the PS solution is sonicated for 1 minute so the resultant solution has lower density than water; (4) a transparent conductive glass soaked with surfactant sodium dodecyl sulfate is submerged in the deionized water bath; (5) the sonicated PS solution is continuously dispensed onto the water bath surface forming the PS monolayer; (6) the monolayer is transfer to the glass substrate by draining the water bath in a controlled rate of 4 ml/min. The second step involves RIE of the monolayer using $O_2$ gas. Flow rate of 40 SCCM of $O_2$ with 30 W radio frequency power is applied for 3 minute. Thus, the diameter of the 100 nm PS is reduced to approximately 58 nm. Thirdly, plasmonic metal is evaporated onto the patterned glass substrate at vacuum of $5 \times 10^{-6}$ Torr or lower to prevent oxidation. Finally, RIE with 40 SCCM $O_2$ with 50 W for 5 minute is used to remove the PS, leaving nanoholes equals to the diameter of the PS on the conductive glass. The three aforementioned crucial parameters: (1) the inter-hole spacing is controlled by the drainage speed during monolayer transfer; (2) the final diameter of the nanohole is determined primarily by the PS particle diameter in the RIE step; and (3) the final thickness of the nanoholes layer is controlled by the final plasmonic metal deposition thickness and determined by the PS diameter after RIE. By controlling these parameters, LSPR frequency of nanoholes matrix can be tuned across the AM1.5 solar spectrum.

In some embodiment, the LSPR frequency of the plasmonic nanoshells is determined by the nanometer scale core diameter to shell thickness ratio. In order to control the core-shell ratio, combination of molecular self-assembly and reduction chemistry of metal colloid is employed. Organosilane molecules, for example 3-aminopropyltriethoxysilane (APTES), are chemically adsorbed onto the dielectric nanocore and extend their amine groups outward as a termination of the nanoparticle surface. The process includes: (1) preparation of 1% APTES by volume with anhydrous toluene; (2) mixing the 4% by weight silica nanocore with the APTES solution and stirring it for 1 minutes; (3) the solution is then kept in 25 degree Celsius for 1 hours forming an ultrathin APTES film over the silica nanocore; (4) the silane coated silica nanoparticle is isolated by centrifuge for metal colloid coating. A solution containing 1 nm to 2 nm gold colloid is added to the silane coated silica core. The gold particles are covalently bonded to the APTES linkage molecules via the amine group. The observed gold colloid coverage by transmission electron micrography (TEM) is approximately 30% which most likely limited by interparticle Coulomb repulsion. Subsequence reduction with an aged mixture of chloroauric acid and potassium carbonate by a solution of sodium borohydride, where the gold-seeded silica nanoparticles are used as the nucleation sites for reduction, results in the increase of gold coverage on the nanoparticle surface. Thus, thickness of the gold nanoshell can be adjusted experimentally and the LSPR frequency of nanoshells can be tuned across the AM1.5 solar spectrum.

Figure 5:
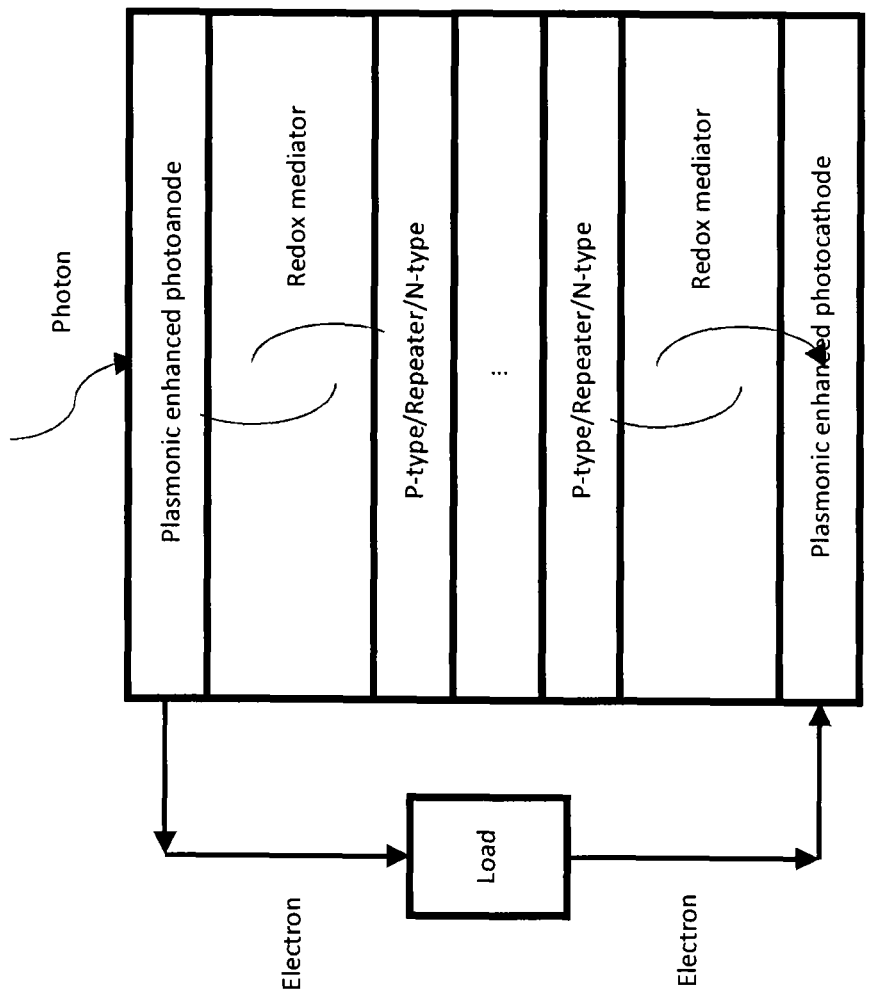
FIG. 5 shows the schematic of another embodiment of double layer plasmonic enhanced tandem dye-sensitized solar cell.
Figure 9:
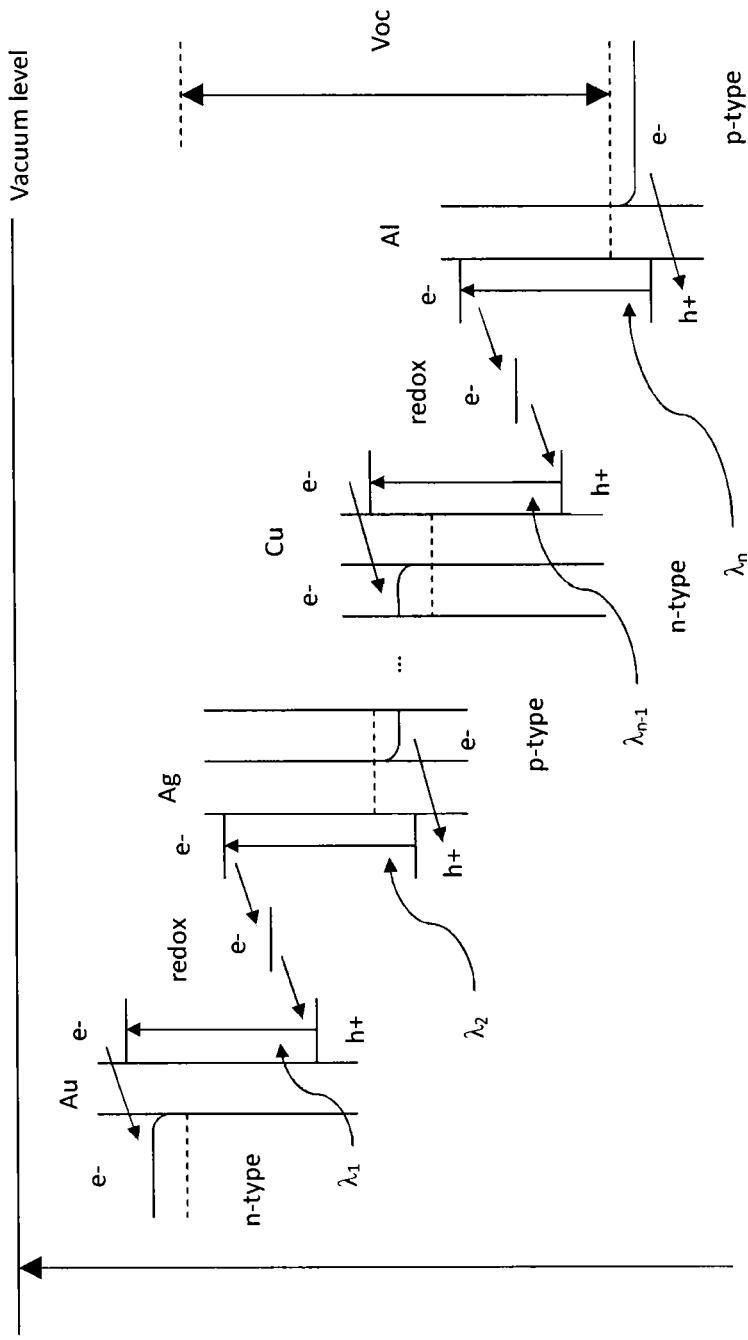
FIG. 9 shows an ideal energy level diagram of an embodiment of a multilayer plasmonic enhanced tandem dye sensitized solar cell indicating the desired electron transfer processes and differential photon absorption in corresponding photoactive electrodes.

FIG. 5 illustrates the plasmonic enhanced TDSSC with double layer configuration. The repeater layer consists of a conductive polymer material such as poly(pyrrole)s, polyanilines, poly(acetylene)s, poly(p-phenylene vinylene) and blended with metallic particles or graphene flakes as the conductive substrate. In certain embodiment, the repeater layer consists of a metal oxide such as titanium oxides, tin oxides, zinc oxides, indium-doped tin oxides comprises metallic particles or graphene flakes. The synthesis of polymer repeater layer for tandem solar cell is described in U.S. Pat. No. 8,158,881, whereas the fabrication of metal oxide conductive layer is described in U.S. Pat. No. 4,904,526. Plasmonic nanostructures described in FIG. 2 are integrated into each photoactive layer. Hence, the double layer TDSSC configuration provides four photoactive layers in harvesting the AM1.5 solar spectrum whereas the single layer TDSSC in FIG. 4 has only two. With the plasmonic nanostructures act as the band-pass filters targeting respective section of the AM1.5 solar spectrum, the photon harvesting efficiency is double. This is advantageous against the single layer TDSSC because it is difficult to generate broadband LSPR with a plasmonic monolayer. A schematic idealized energy level diagram of a plasmonic enhanced TDSSC indicating the desired electron transfer processes in FIG. 9.

Figure 6:
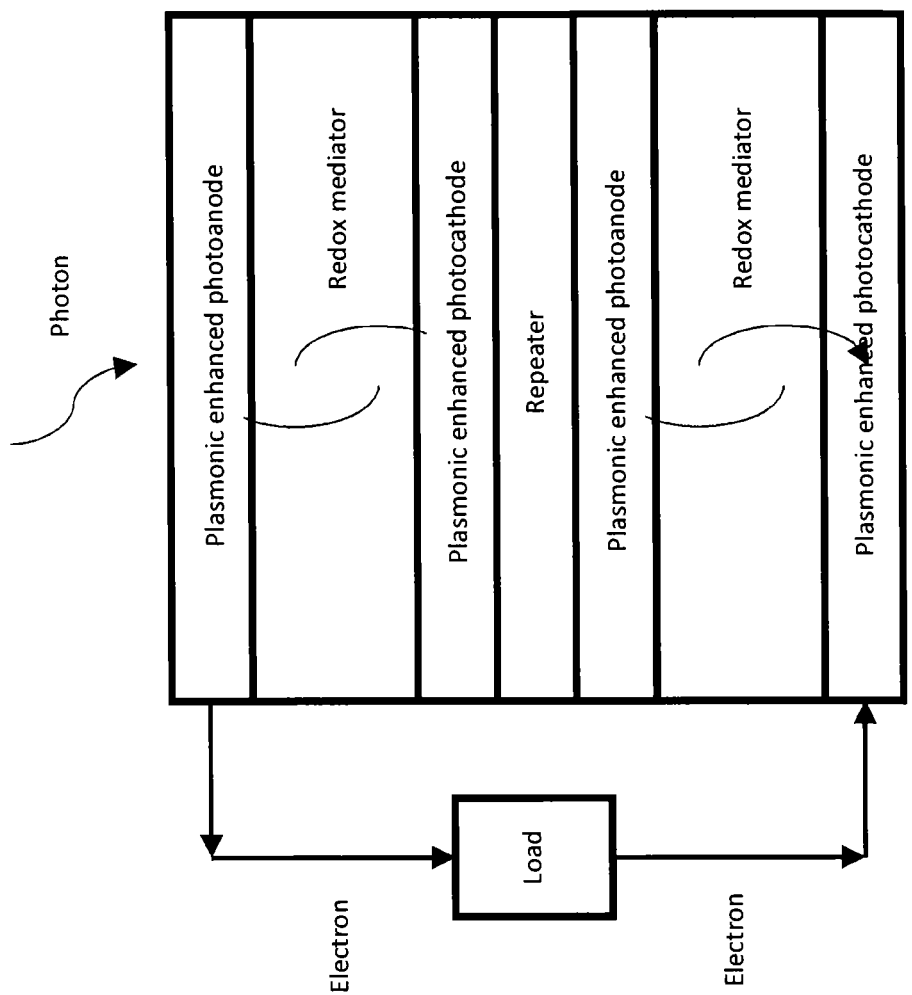
FIG. 6 shows the schematic of a further embodiment of multiple layer plasmonic enhanced tandem dye-sensitized solar cells.

FIG. 6 illustrates the plasmonic enhanced TDSSC with multilayer configuration. Plasmonic nanostructures described in FIG. 2 are integrated into each photoactive layer. The single layer plasmonic enhanced TDSSC described in FIG. 4 forms the elementary unit for the multilayer configuration. Hence, the multilayer TDSSC configuration provides multiple photoactive layers in harvesting the AM1.5 solar spectrum whereas the double layer TDSSC in FIG. 5 has only four. With the plasmonic nanostructures acting as the band-pass filters targeting respective section of the AM1.5 solar spectrum, the photon harvesting efficiency is multiplied according to the number of layers as shown in FIG. 6. This is advantageous against the single layer and double layer TDSSC because broadband LSPR is generated with multiple plasmonic monolayers.

Figure 7A:
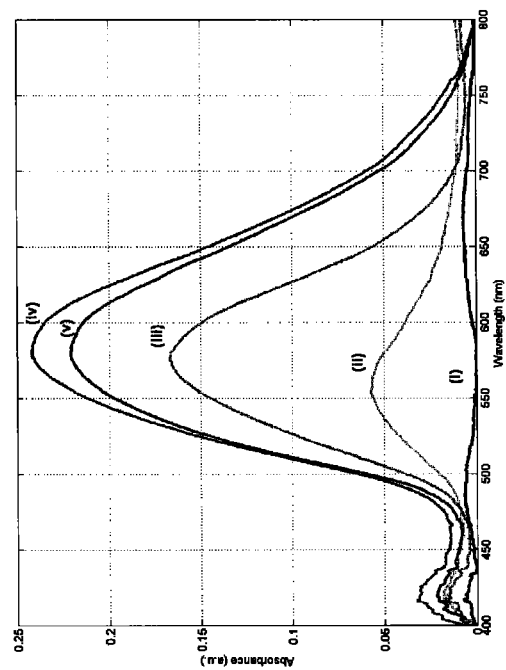
FIG. 7a shows the optical extinction of an embodiment of plasmonic self-assembly nanoisland integrated to a photoactive nanocrystalline $TiO_2$ semiconductor, where (i) to (iv) represents the reference without gold, 3 nm, 7 nm, 9 nm, and 11 nm nominal gold deposition thickness, respectively.
Figure 7B:
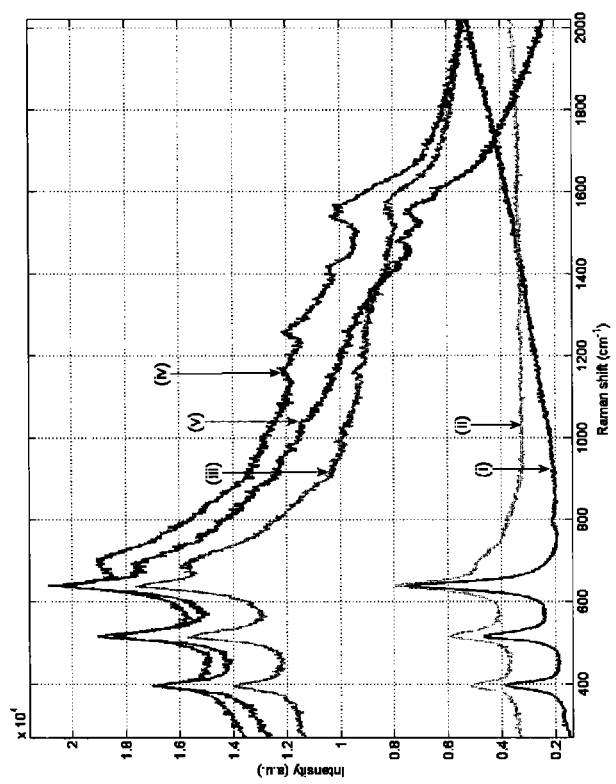
FIG. 7b shows the surface enhanced Raman scattering of 1 uM N-719 dye sensitizer on an embodiment of plasmonic self-assembly nanoisland integrated to a photoactive nanocrystalline $TiO_2$ semiconductor, where (i) to (iv) represents the reference without gold, 3 nm, 7 nm, 9 nm, and 11 nm nominal gold deposition thickness, respectively.

In order to demonstrate the plasmonic enhancement to the DSSC photoanode, the configuration shown in FIG. 2a is fabricated and tested. The self assembly nanoisland cluster on mesoporous TiO$_2$ photoanode is magnified and shown in FIG. 3. Optical extinctions of plasmonic self-assembly nanoisland synthesized with different nominal gold deposition thicknesses and integrated to the photoactive nanocrystalline TiO$_2$ semiconductor are measured and shown in FIG. 7a. It is apparent that the optical extinction increases as the nominal gold deposition thickness increases from 3 nm to 9 nm until a threshold of 11 nm of gold is reached. The maximum extinction wavelength also shifts towards the longer wavelength from 560 nm for 3 nm of gold to 580 nm for 9 nm of gold. FIG. 7b shows the surface enhanced Raman scattering of 1 uM N-719 dye sensitizer on these plasmonic self-assembly nanoisland integrated to the photoactive nanocrystalline TiO$_2$ semiconductor. With the presence of self-assembly nanoisland, the Raman signature of N-719 dye is significantly amplified. The amount of amplification increases from 3 nm to 9 nm then falls with 11 nm of gold. This is well correlated with the optical extinction shown in FIG. 7a and nanoislands with 9 nm gold deposition demonstrate the highest peak to valley N-719 Raman scattering signal.

Figure 8A:
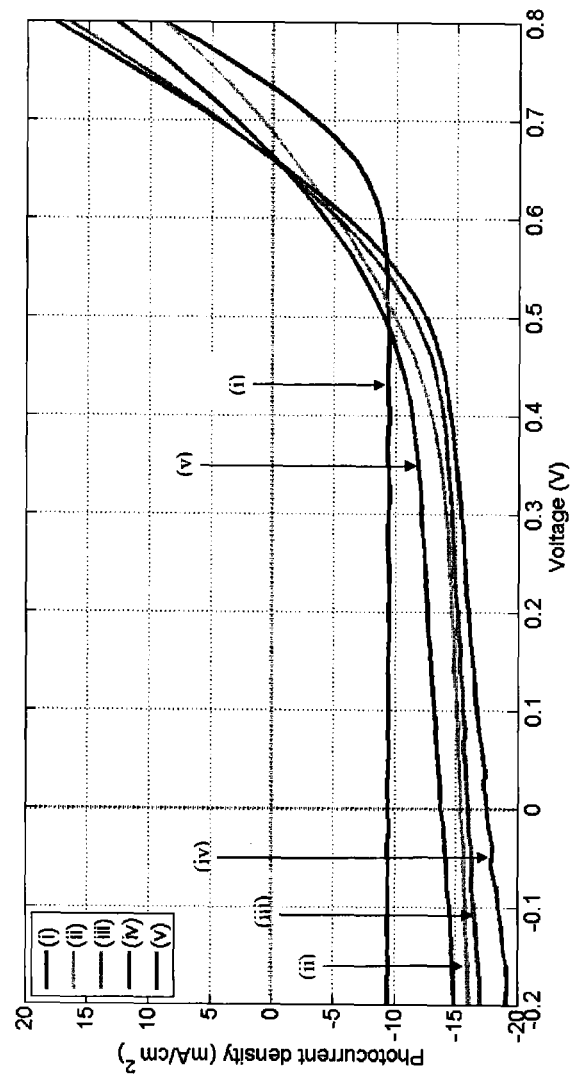
FIG. 8a shows the photocurrent density against voltage of an embodiment of dye-sensitized solar cell with plasmonic self-assembly nanoisland integrated to the $TiO_2$ n-type photoanode, where (i) to (iv) represents the reference without gold, 3 nm, 7 nm, 9 nm, and 11 nm nominal gold deposition thickness, respectively.
Figure 8B:
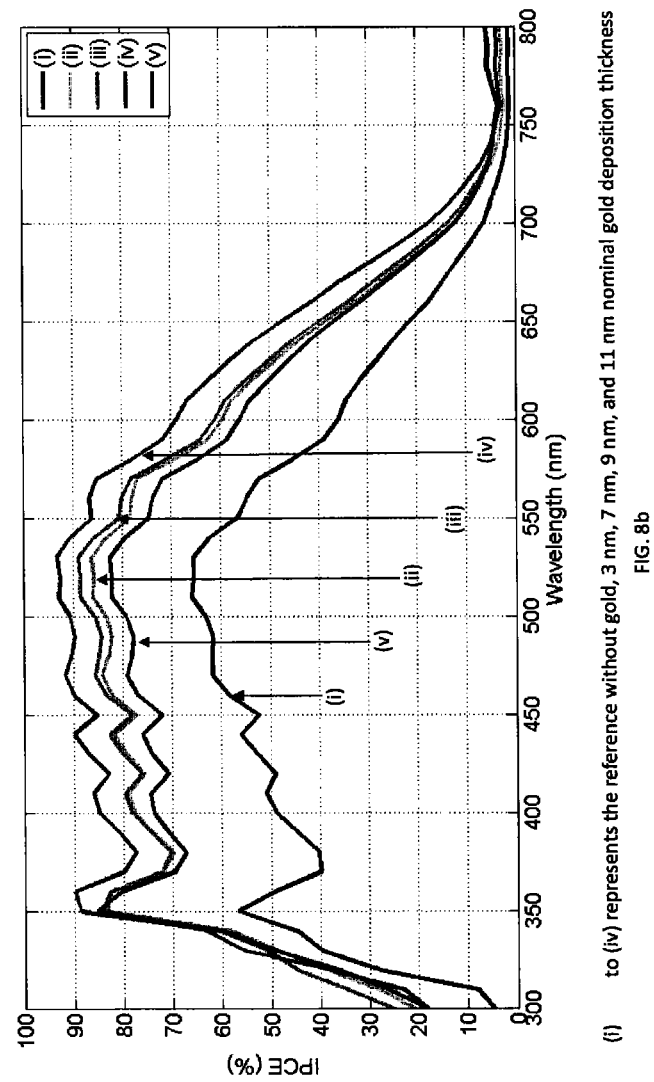
FIG. 8b shows the incident photon-to-electron conversion efficiency of an embodiment of N719 dye-sensitized solar cell with plasmonic self-assembly nanoisland integrated to the $TiO_2$ n-type photoanode, where (i) to (iv) represents the reference without gold, 3 nm, 7 nm, 9 nm, and 11 nm nominal gold deposition thickness, respectively.

The plasmonic enhanced DSSC with a single photoanode stained with N-719 dye is assembled and tested. FIG. 8a shows the photocurrent density against voltage of the reference DSSC without plasmonic enhancement and those with self-assembly nanoisland integrated to the TiO$_2$ n-type photoanode. A solar simulator (Newport) at 1 sun is employed to measure the photocurrent generated as the voltage scans from −0.2 V to 0.8 V in 0.01 V per step. Performance of the solar cell is benchmarked according to the following equation, $$\eta = \frac{J_{sc} V_{oc}}{P_{in}} \times FF,$$

where η is electric power conversion efficiency (PCE), $J_{sc}$ is the short circuit photocurrent density in mA·cm$^{-2}$, $V_{oc}$ is the open circuit voltage in V, $P_{in}$ is the light intensity of the solar simulator, FF represents the fill factor which is defined as the ratio between the maximum power output density and the product of $J_{sc}V_{oc}$. The results show that with the introduction of plasmonic nanoislands, $J_{sc}$ increases gradually in accordance to the trend of optical extinction and Raman scattering. The maximum $J_{sc}$ reaches 24.6 mA·cm$^2$ with 9 nm of gold deposition and self-assembly nanoisland formation, whereas the reference cell only delivers 14.2 mA·cm$^2$, thus the best plasmonic enhanced cell outperforms the reference $J_{sc}$ by 73%. However, it is observed that the $V_{oc}$ drops from 0.77 V to 0.68 V by 90 mV, but it does not affects the overall performance. Assuming 100 mW·cm$^2$ total power density of 1 sun, the fill-factor of the plasmonic enhanced DSSC is 0.46 whereas the reference cell is 0.49. The best PCE delivered by the plasmonic enhanced DSSC is the 7.6% whereas the reference PCE is 4.9%, thus an improvement of 55% is observed. FIG. 8b shows the incident photon-to-electron conversion efficiency (IPCE) of the same patch of cells. The spectral responses indicate that these plasmonic nanoislands generally increase the N-719 IPCE from 70% to 80% for relatively short wavelengths, i.e. from 400 nm to 600 nm. For relatively longer wavelengths, i.e. 600 nm to 800 nm, the plasmonic enhancement is much more significant. IPCE is boosted from almost negligible to about 80% for 800 nm, which is never possible for the N-719 dye alone.

The following further summarizes different aspects and contribution of the present invention.

1. This present invention discloses the design and fabrication of plasmonic nanostructures in the application of tandem dye-sensitized solar cell (TDSSC) to enhance electric power production.
2. The present invention teaches the use of a plurality of plasmonic nanoisland synthesized and integrated with the mesoporous semiconducting photoactive layer via physical vapor deposition (PVD) then self-assembly thermal annealing.
3. The present invention teaches a plurality of plasmonic nanoshell synthesized and integrated with mesoporous semiconducting photoactive layer via electrochemical plating.
4. The present invention teaches plasmonic nanopillars matrices synthesized and integrated with mesoporous semiconducting photoactive layer via nanosphere lithography.
5. The present invention teaches the use of plasmonic nanoholes matrices synthesized and integrated with the mesoporous semiconducting photoactive layer via nanosphere lithography.
6. The present invention demonstrates a solar system which makes use of first and second transparent conductive oxide electrodes; an n-type mesoporous dye-sensitized photoactive layer in contact with the first electrode; a plurality of plasmonic nanostructures integrates with the photoactive layer; a redox electron-hole shuttling medium between the photoactive layer and the second electrode. The system functions as a photovoltaic cell.
7. The present invention demonstrates a system which makes use of first and second transparent conductive oxide electrodes; a p-type mesoporous dye-sensitized photoactive layer in contact with the second electrode; a plurality of plasmonic nanostructures integrates with the photoactive layer; a redox electron-hole shuttling medium between the photoactive layer and the first electrode. The system functions as a photovoltaic cell.
8. The present invention demonstrates a system which makes use of first and second transparent conductive oxide electrodes; an n-type mesoporous dye-sensitized photoactive layer in contact with the first electrode; a p-type mesoporous dye-sensitized photoactive layer in contact with the second electrode; a plurality of plasmonic nanostructures integrates with the n-type photoactive layer; a plurality of plasmonic nanostructures integrates with the p-type photoactive layer; a redox electron-hole shuttling medium between the two photoactive layers. The system functions as a tandem photovoltaic cell.
9. The present invention demonstrates a system which makes use of first and second transparent conductive oxide electrodes; multiple electron-hole transporting repeaters between the two electrodes; an n-type mesoporous dye-sensitized photoactive layer in contact with the first electrode; multiple layers of p-type/repeater/n-type photoactive structures in between the two electrodes; a p-type mesoporous dye-sensitized photoactive layer in contact with the second electrode; a plurality of plasmonic nanostructures integrates with each n-type photoactive layer; a plurality of plasmonic nanostructures integrates with each p-type photoactive layer; a redox electron-hole shuttling medium between each photoactive layers. The system functions as a tandem photovoltaic cell.

It should be understood that certain features of the invention, which are, for clarity, described in the content of separate embodiments, may be provided in combination in a single embodiment. Conversely, various features of the invention which are, for brevity, described in the content of a single embodiment, may be provided separately or in any appropriate sub-combinations. It is to be noted that certain features of the embodiments are illustrated by way of non-limiting examples. Also, a skilled person in the art will be aware of the prior art which is not explained in the above for brevity purpose. It is also be noted that the following contend of references listed below are incorporated in their entirety in this description.

[1] Odobel et al., "Recent advances and future directions to optimize the performances of p-type dye-sensitized solar cells," Coordination Chemistry Reviews, article in press, April, 2012.
[2] Yella et al., "Porphyrin-Sensitized Solar Cells with Cobalt II-III-Based Redox Electrolyte Exceed 12 Percent Efficiency," Science, 334, 629-634, 2011.
[3] Hagfeldt et al., "Dye-Sensitized Solar Cells," Chemical Reviews, 110, 6595-6663, 2010.
[4] Barcelo et al., "Nanosphere lithography based technique for fabrication of large area, well ordered metal particle arrays," HP Laboratories Report, March, 2012.
[5] Oldenburg et al., "Nanoengineering of optical resonances," Chemical Physics Letters, 288, 243-247, 1998.
[7] U.S. Pat. No. 7,417,219—"Effect of the plasmonic dispersion relation on the transmission properties of subwavelength holes"
[8] U.S. Pat. No. 8,158,881—"Tandem photovoltaic cells"
[9] US 2009/0032097—"Enhancement of dye-sensitized solar cells using colloidal metal nanoparticles"

The invention claimed is:

1. A plasmonic enhanced tandem dye sensitized solar cell system comprising plasmonic nanostructures integrated to both a photoanode and a photocathode for enhancing respective electron and hole carrier transfer, wherein the photoanode comprises:
   a) a mesoporous n-type semiconducting material arranged on a transparent conductive substrate;
   b) plasmonic nanostructures integrated to an n-type semiconducting material acting as an electron acceptor material; and
   c) a dye sensitizer acting as an electron donor material.

2. A system as claimed in claim 1, wherein:
   a) a mesoporous p-type semiconducting material arranged on the transparent conductive substrate;
   b) plasmonic nanostructures integrated to a p-type semiconducting material acting as a p-type semiconductor as the hole acceptor material; and
   c) a dye sensitizer acting as a hole donor material; and
   the mesoporous n-type and p-type semiconducting materials are in the form of layers, and the plasmonic nanostructures comprise a plurality of plasmonic nanoislands synthesized and integrated with the mesoporous semiconducting photoactive layers via physical vapor deposition (PVD) and then self-assembly thermal annealing.

3. A system as claimed in claim 2, wherein the dye sensitizer acting as an electron donor material includes a metal complex selected from a group including Ruthenium (Ru), Osmium (Os), Rhenium (Re), Platinum (Pt), Iron (Fe), Copper (Cu) and respective metal complexes derivatives thereof; and/or porphyrins, chlorophylls, phthalocyanines and respective derivatives thereof; and/or organic dyes selected from a group including coumarin dyes, indoline dyes, tetrahydroquinoline dyes, triarylamine dyes, heteroanthracene dyes, carbazole dyes, N,N-dialkylaniline dyes, hemicyanine dyes, merocyanine dyes, squaraine dyes, perylene dyes, anthraquinone dyes, boradiazaindacene dyes, oligothiophene dyes, polymeric dyes and respective derivatives thereof.

4. A system as claimed in claim 2, wherein the n-type semiconducting material acting as an electron acceptor material includes an n-type semiconducting metal oxide selected from a group including titanium oxides, zinc oxides, tungsten oxides, molybdenum oxides.

5. A system as claimed in claim 2, wherein the dye sensitizer acting as a hole donor material includes "push-pull" dyes with a carboxylic acid derivatized triarylamine core as the electron "push" moiety and electron accepting groups, and 2-(3,5,5-trimethylcyclohex-2-enylidene)-malononitrile acting as electron "pull" moiety.

6. A system as claimed in claim 2, wherein the dye sensitizer acting as a hole donor material includes "donor-sensitizer" dyes with a secondary electron acceptor covalently appended to anchored chromophore moiety.

7. A system as claimed in claim 2, wherein the dye sensitizer acting as a hole acceptor material includes a p-type semiconducting metal oxide.

8. A system as claimed in claim 2, wherein at least one of the plasmonic nanostructures includes a metal selected from a group including gold, silver, copper, and aluminum; the plasmonic nanostructure includes a plurality of self-assembly nanoislands of gold, silver, copper, aluminum or combination thereof; the plasmonic nanostructure includes matrices of nanopillars of gold, silver, copper, aluminum; the plasmonic nanostructure comprises matrices of nanoholes of gold, silver, copper, aluminum; and/or the plasmonic nanostructure includes metal-insulator nanoshells made of gold, silver, copper, aluminum with an insulator core made of silicon oxides, titanium oxides, zinc oxides.

9. A system as claimed in claim 2, comprising a redox mediator between the photoanode and the photocathode, wherein the redox mediator includes liquid redox electrolytes, gel and polymer electrolytes, ionic liquid electrolytes, solid organic hole conductors, and inorganic solid hole conductors.

10. A system as claimed in claim 2, wherein the n-type semiconducting layer is disposed via a first liquid-based coating process onto the transparent conductive substrate, and the p-type semiconducting layer is disposed via a second liquid-based coating process onto the transparent substrate.

11. A system as claimed in claim 10, wherein the first or second liquid based coating process is selected from a group of including solution coating, ink jet printing, spin coating, dip coating, knife coating, bar coating, spray coating, roller coating, slot coating, gravure coating, flexographic printing, or screen printing.

12. A system as claimed in claim 1 adpoting an at least two-layer configuration, configured with tunable optical resonance for harvesting an entire AM1.5 solar spectrum, and comprising a repeater layer arranged between the at least two-layer configuration, wherein the repeater layer comprises a conductive polymer; and/or metal oxide.

13. A plasmonic enhanced tandem dye sensitized solar cell system comprising plasmonic nanostructures integrated to both a photoanode and a photocathode for enhancing respective electron and hole carrier transfer,
wherein the photoanode comprises:
   a) a mesoporous n-type semiconducting material arranged on a transparent conductive substrate;
   b) plasmonic nanostructures integrated to an n-type semiconducting material acting as an electron acceptor material; and
   c) a dye sensitizer acting as an electron donor material;
wherein the photocathode comprises:
   d) a mesoporous p-type semiconducting material arranged on the transparent conductive substrate;
   e) plasmonic nanostructures integrated to a p-type semiconducting material acting as a p-type semiconductor as the hole acceptor material; and
   f) a dye sensitizer acting as a hole donor material.

14. A system as claimed in claim 13, wherein the mesoporous n-type and p-type semiconducting materials are in the form of layers, and the plasmonic nanostructures comprise a plurality of plasmonic nanoislands synthesized and integrated with the mesoporous semiconducting photoactive layers via physical vapor deposition (PVD) and then self-assembly thermal annealing.

* * * * *